United States Patent
Yang et al.

(10) Patent No.: US 9,117,831 B2
(45) Date of Patent: Aug. 25, 2015

(54) SEAL RING STRUCTURE FOR INTEGRATED CIRCUIT CHIPS

(75) Inventors: Ching-Jung Yang, Pingzhen (TW); Yu-Wen Liu, Taipei (TW); Michael Shou-Ming Tong, San Diego, CA (US); Hsien-Wei Chen, Sinying (TW); Chung-Ying Yang, Taoyuan (TW); Tsung-Yuan Yu, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 910 days.

(21) Appl. No.: 13/004,261

(22) Filed: Jan. 11, 2011

(65) Prior Publication Data

US 2012/0175728 A1    Jul. 12, 2012

(51) Int. Cl.
*H01L 23/00* (2006.01)
*H01L 23/58* (2006.01)

(52) U.S. Cl.
CPC ............ *H01L 23/564* (2013.01); *H01L 23/585* (2013.01); *H01L 2924/0002* (2013.01)

(58) Field of Classification Search
CPC .............................. H01L 23/10; H01L 23/585

USPC .......... 257/620, 758, 775, E23.002, E23.193, 257/E23.194; 438/462, 638

See application file for complete search history.

(56) References Cited

U.S. PATENT DOCUMENTS

| | | | | |
|---|---|---|---|---|
| 5,880,528 | A  * | 3/1999 | Seshan et al. | 257/776 |
| 2007/0090447 | A1* | 4/2007 | Morimoto et al. | 257/316 |
| 2008/0283969 | A1* | 11/2008 | Jeng et al. | 257/620 |
| 2011/0057297 | A1* | 3/2011 | Lee et al. | 257/620 |

FOREIGN PATENT DOCUMENTS

CN          1956173          5/2007

OTHER PUBLICATIONS

Office Action dated Aug. 30, 2013 from corresponding application No. CN 201110148043.0.

* cited by examiner

*Primary Examiner* — Daniel Shook
(74) *Attorney, Agent, or Firm* — Lowe Hauptman & Ham, LLP

(57) ABSTRACT

A semiconductor device includes a substrate having a circuit region and a seal ring region. The seal ring region surrounds the circuit region. A seal ring structure is disposed over the seal ring region. The seal ring structure has a first portion and a second portion above the first portion. The first portion has a width W1, and the second portion has a width W2. The width W1 is less than the width W2.

19 Claims, 14 Drawing Sheets

SEAL RING STRUCTURE FOR INTEGRATED CIRCUIT CHIPS

TECHNICAL FIELD

The disclosure relates generally to semiconductor integrated circuit chip designs, and more particularly, to a seal ring structure and methods of forming a seal ring structure to protect an integrated circuit chip.

BACKGROUND

In an integrated circuit (IC) formation process, semiconductor wafers, each including a plurality of identical semiconductor chips, are manufactured first. After manufacturing, the semiconductor wafers are sawed to separate the semiconductor chips, so that each of the semiconductor chips may be packaged individually.

A seal ring structure is used to protect the IC from moisture degradation, ionic contamination, and damage during dicing and packaging processes.

In some arrangements, the seal ring structure occupies a large width of the chip area of each die. Therefore, the effective chip area for functional integrated circuits is reduced for each die. To gain more effective chip area, the chip area for each die must be increased. Hence, the total die number within one wafer becomes less and the cost for each die becomes higher.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

A plurality of dies are fabricated on a semiconductor wafer. The plurality of dies are divided by scribe lines between the dies. The term "wafer" herein generally refers to the semiconductor substrate on which various layers and device structures are formed. In some embodiments, the semiconductor substrate includes silicon or compound semiconductor, such as GaAs, InP, Si/Ge, or SiC. Examples of such layers include dielectric layers, doped layers, and/or polysilicon layers. Examples of device structures include transistors, resistors, and/or capacitors, which may or may not be interconnected through an interconnect layer to additional active circuits.

Figure 1:
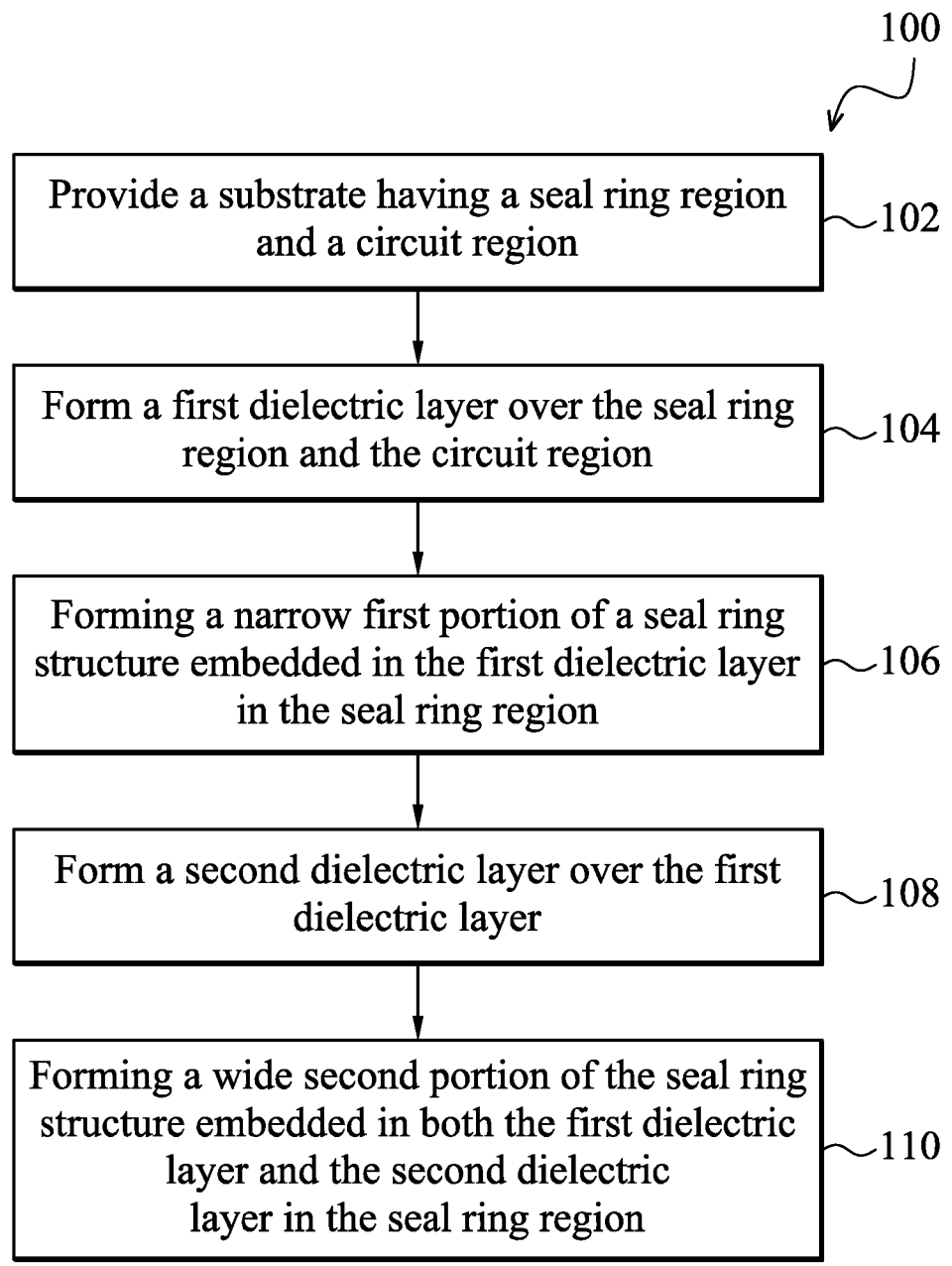
FIG. 1 is a flowchart of a method for fabricating semiconductor device with a seal ring structure according to embodiments of the disclosure.

Referring now to FIG. 1, method 100 for fabricating a semiconductor device with a seal ring structure begins with block 102. At block 102, a semiconductor substrate is provided. The substrate has a seal ring region and a circuit region. The seal ring region surrounds the circuit region. The method 100 continues with block 104 in which a first dielectric layer is formed over the seal ring region and the circuit region, i.e., over the semiconductor substrate. The method 100 continues with block 106 in which a first portion of a seal ring structure is formed and embedded in the first dielectric layer in the seal ring region. The method 100 continues with block 108 in which a second dielectric layer is formed over the first dielectric layer. In one embodiment, the first dielectric layer and the second dielectric layer have different dielectric constants. The method 100 continues with block 110 in which a second portion of the seal ring structure wider than the first portion is formed and embedded in both the first dielectric layer and second dielectric layer in the seal ring region. The second portion of the seal ring structure is above the first portion of the seal ring structure. Other layers, lines, vias and structures may also be provided before, during, or after the steps of method 100. The described process order is variable in further embodiments.

Figure 2:
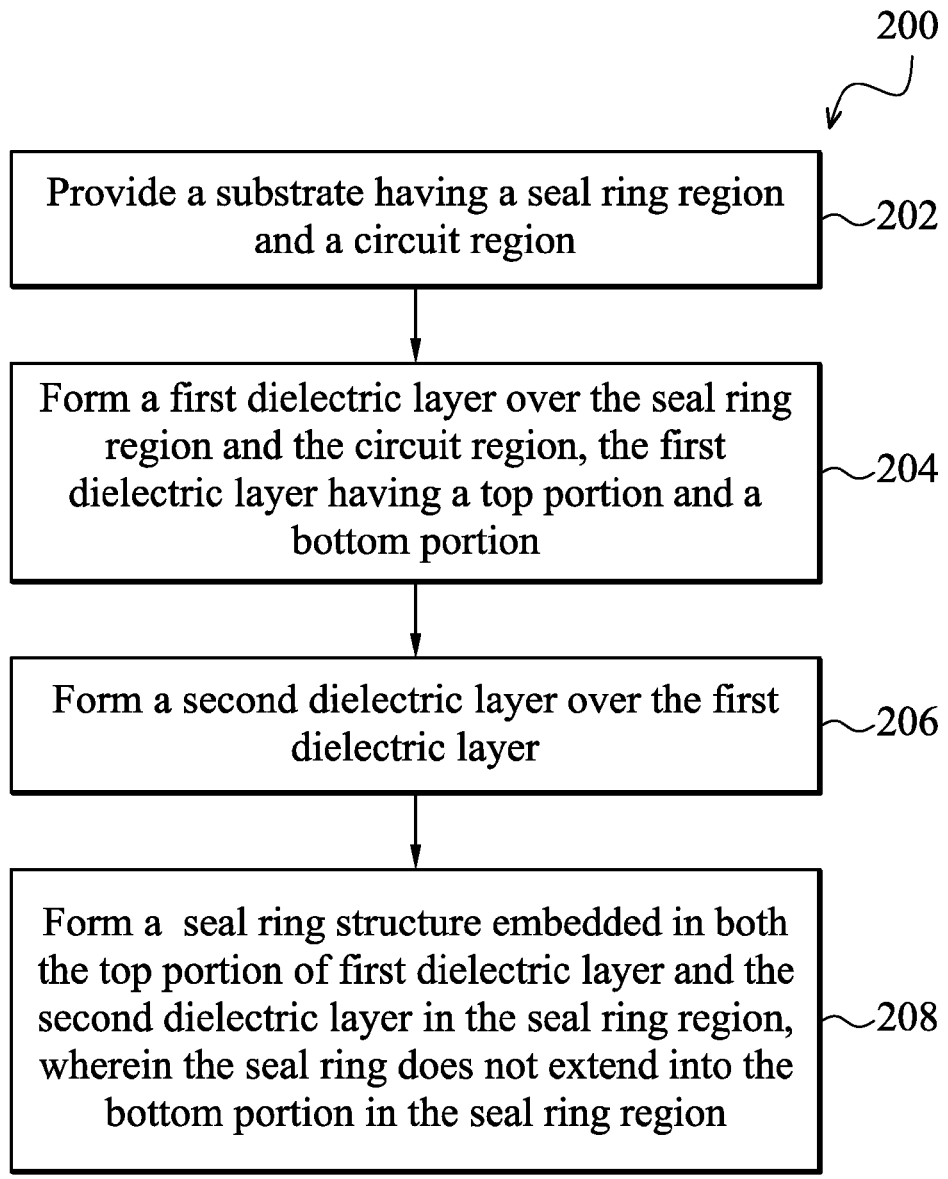
FIG. 2 is another flowchart of a method for fabricating semiconductor device with a seal ring structure according to embodiments of the disclosure.

Referring now to FIG. 2, method 200 for fabricating a semiconductor device with a seal ring structure begins with block 202. At block 202, a semiconductor substrate is provided. The substrate has a seal ring region and a circuit region. The seal ring region surrounds the circuit region. The method 200 continues with block 204 in which a first dielectric layer is formed over the seal ring region and the circuit region, i.e., over the semiconductor substrate. The first dielectric layer has a top portion and a bottom portion. The method 200 continues with block 206 in which a second dielectric layer is formed over the first dielectric layer. In one embodiment, the first dielectric layer and the second dielectric layer have different dielectric constants. The method 200 continues with block 208 in which a seal ring structure is formed and embedded in both the second dielectric layer and the top portion of the first dielectric layer in the seal ring region. The seal ring structure does not extend into the bottom portion of the first dielectric layer in the seal ring region. In one embodiment, the bottom portion of the first dielectric layer does not contain any seal ring structure. Other layers, lines, vias and structures may also be provided before, during, or after the steps of method 200. The described process order is variable in further embodiments.

Figure 3:
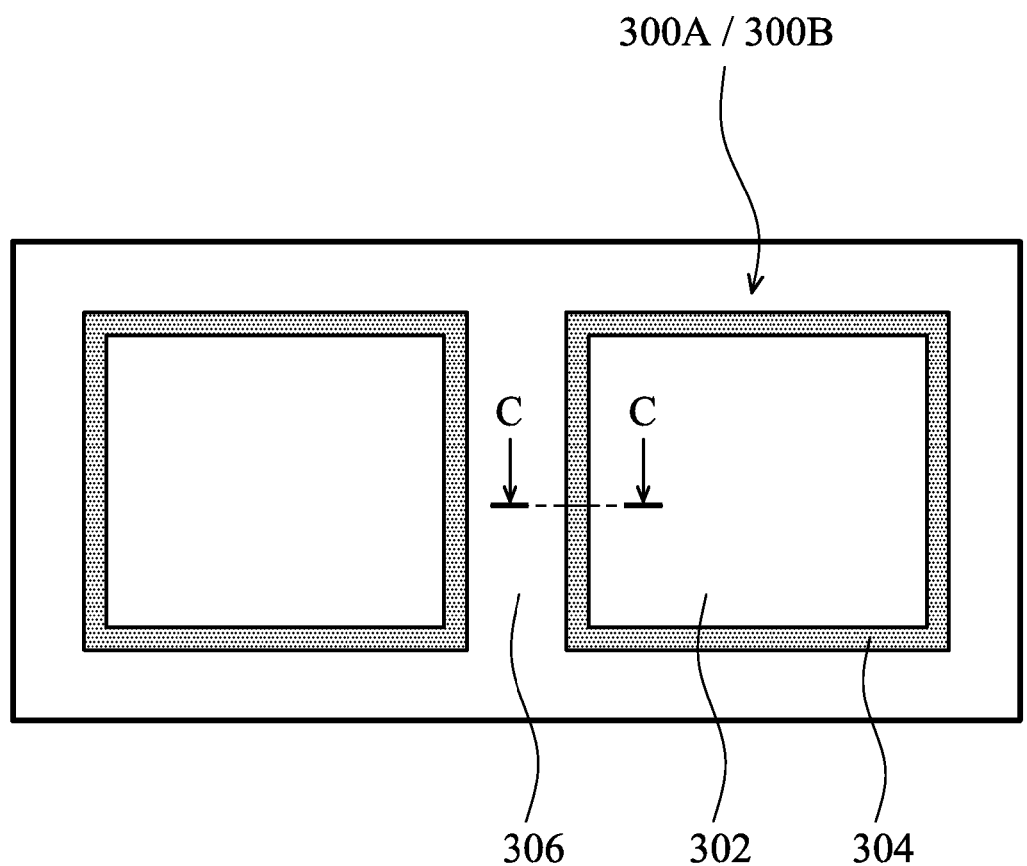
FIG. 3 is a top plan view of two integrated circuit (IC) dies with seal ring structures according to various aspects of the present disclosure.
Figure 4:
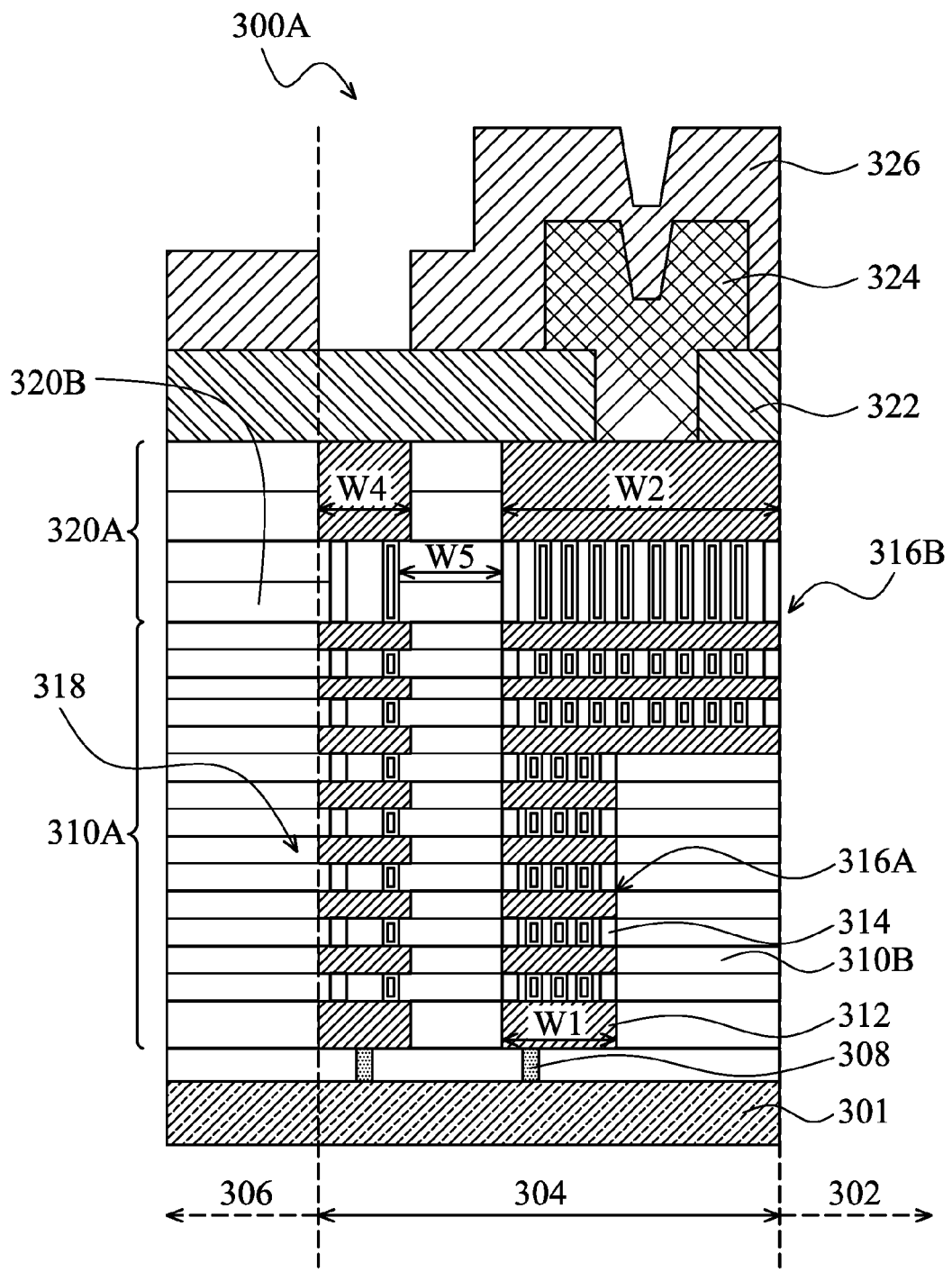
FIGS. 4, 5, and 14 are cross-sectional views along line C-C' in FIG. 3 of alternative seal ring structures according to various aspects of the present disclosure.
Figure 5:
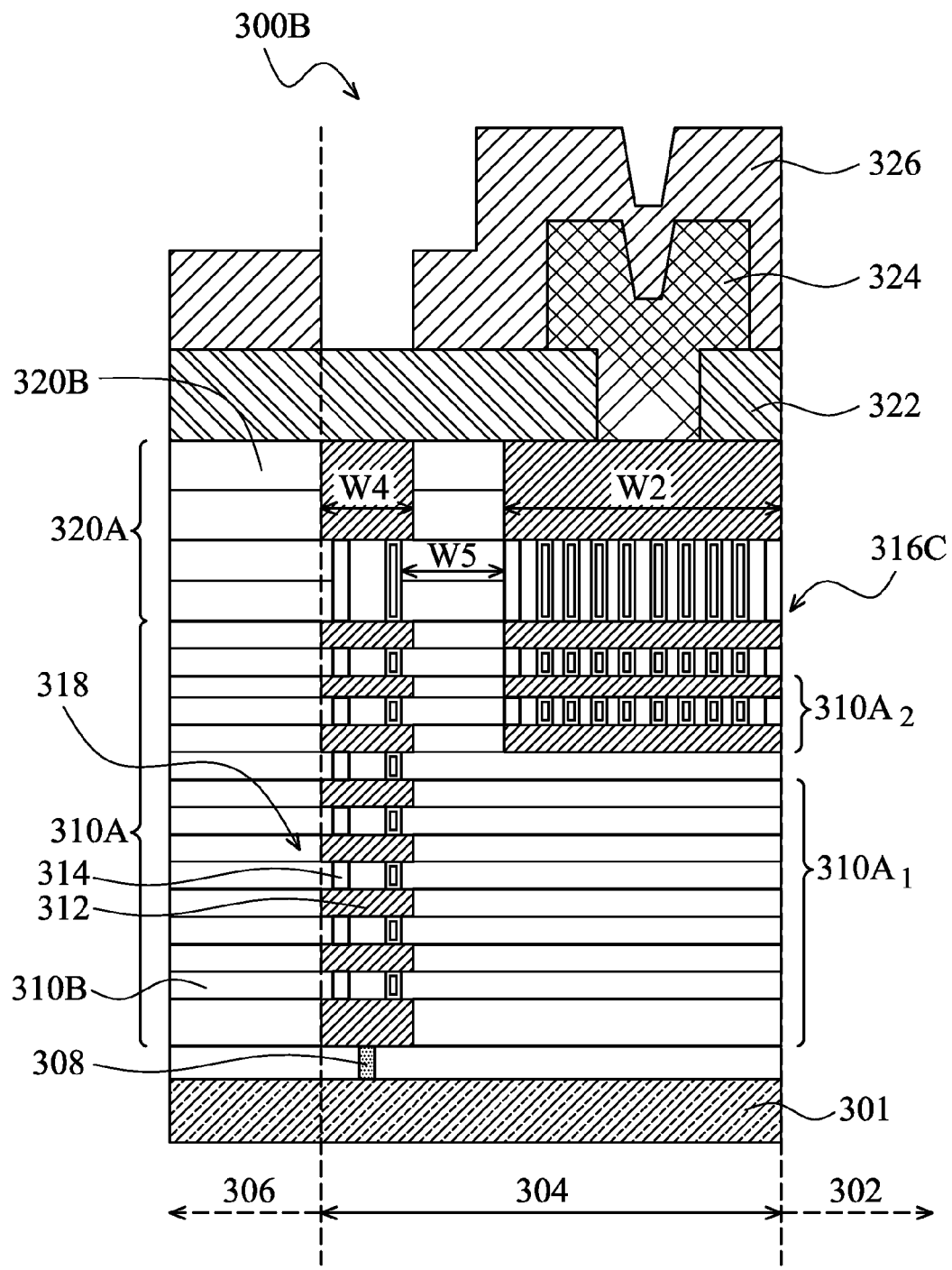

FIG. 3 is a top plan view of two integrated circuit (IC) dies or devices with seal ring structures according to various aspects of the present disclosure. A device 300A or 300B includes a circuit region 302, a seal ring region 304 and a scribe line region 306. FIGS. 4 and 5 are cross-sectional views of alternative seal ring structures obtained from the vertical plane crossing line C-C' in FIG. 3.

Referring now to FIG. 4, the semiconductor device 300A may include a semiconductor substrate 301 having a seal ring region 304 and a scribe line region 306 surrounding a circuit region 302. In an embodiment, the seal ring region 304 is for forming a seal ring structure thereon and the circuit region is for forming at least a transistor. The semiconductor substrate 301 may include silicon or compound semiconductor, such as GaAs, InP, Si/Ge, or SiC. The substrate 301 may further include doped regions, such as a P-well, an N-well, and/or a doped active region such as a P+ doped active region.

The device 300A may further include isolation structure, such as shallow trench isolation (STI) features or LOCOS features formed in the substrate 301 for isolating active regions from other regions in the substrate 301. The active regions may be configured as an NMOS device or as a PMOS device in one example.

The device 300A may further include device structures such as transistors, resistors, and/or capacitors (not shown) overlying the substrate 301. The device 300A further includes contact bars 308 to electrically couple the substrate 301 to the subsequently formed seal ring structures 318/316A/316B.

The device 300A includes a first dielectric layer 310A disposed over the seal ring region 304, the scribe line region 306 and the circuit region 302 of the substrate 301. The first dielectric layer 310A may contain multiple dielectric layers 310B. In some embodiments, the dielectric layers 310B are formed of low-k dielectric materials with dielectric constants (k value) between about 2.9 and 3.8, ultra low-k (ULK) dielectric materials with k values between about 2.5 and about 2.9, or some combination of low-k dielectric materials. Typically the lower k value a dielectric layer 310B has, the more fragile and prone to delamination and cracking the layer becomes.

A second dielectric layer 320 A is disposed over the first dielectric layer 310A. The first dielectric layer 310A and the second dielectric layer 320A have different dielectric constants. In one embodiment, a dielectric constant of the first dielectric layer 310A is less than a dielectric constant of the second dielectric layer 320A. The second dielectric layer 320A has more capability to decreases corrosion or mechanical damage to the underlying integrated circuits than the first dielectric layer 310A. The second dielectric layer 320A may contain multiple levels of dielectric layers 320B. In one embodiment, the dielectric layers 320B are formed of oxide, undoped silicate glass (USG), or silicon dioxide ($SiO_2$).

Figure 14:
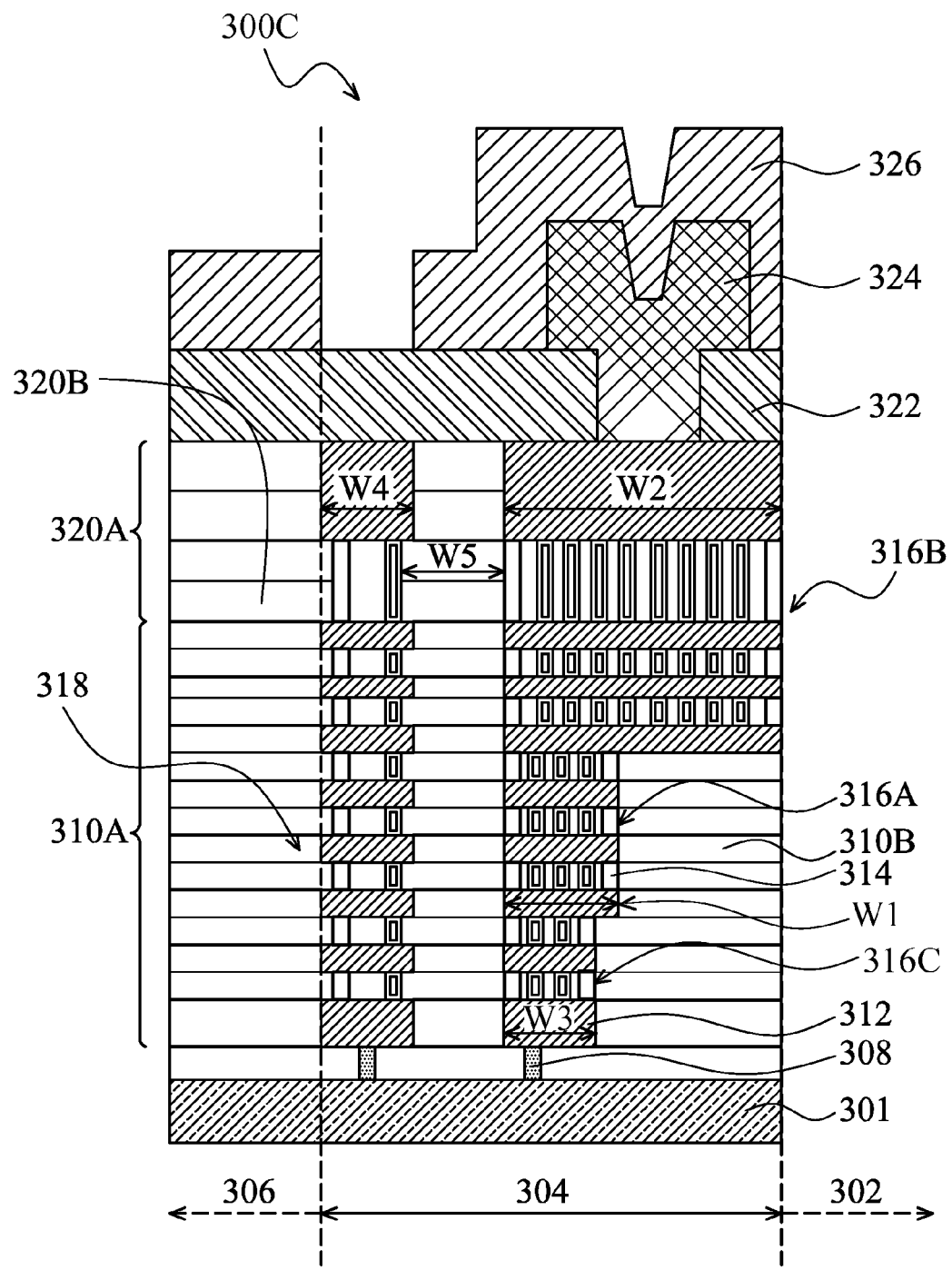

Referring to FIG. 4, a seal ring structure 316A/316B is disposed over the seal ring region 304 and embedded in both the first dielectric layer 310A and the second dielectric layer 320A. The seal ring structure 316A/316B is adjacent to the circuit region 302 and there is no other seal ring structure between the seal ring structure 316A/316B and the circuit region 302. The seal ring structure 316A/316B has a first portion 316A and a second portion 316B above the first portion 316A. The first portion 316A is embedded in the first dielectric layer 310A. The second portion 316B is embedded in both the first dielectric layer 310A and the second dielectric layer 320A. In one example, the second portion 316B has a width W2 between about 4 microns and about 10 microns. The first portion 316A has a width W1, which is less than the width W2. The width W1 is less than 75 percent of the width W2 in some embodiments. Referring to FIG. 14, the device 300C includes a seal ring structure 316A/316B/316C disposed over the seal ring region 304 and embedded in both the first dielectric layer 310A and the second dielectric layer 320A. Components in FIG. 14 that are the same or similar to those in FIG. 4 are given the same reference numbers, and the description thereof is thus omitted. In the embodiment depicted in FIG. 14, the seal ring structure 316A/316B/316C further comprises a third portion 316C below the first portion 316A. The third portion 316C has a width W3, which is less than W1. The width W3 is less than 50 percent of the width W2 in some embodiments. In yet another embodiment, the device 300A further comprises an interconnect, a device structure or an alignment mark (not shown) disposed in the seal ring region 304 under the second portion 316B and adjacent to the first portion 316A, i.e., between the first portion 316A and the circuit region 302. The device structure may include one or more of transistors, resistors, and/or capacitors (not shown) overlying the substrate 301. Advantageously, the seal ring structure 316A/316B with the narrow first portion 316A provides extra space for functional integrated circuits and circuit routing in the seal ring region 304. The seal ring structure 316A/316B with the wide second portion 316B provides robust strength for preventing the intrusion of any cracks into the circuit region 302 along the interface between the first dielectric layer 310A and the second dielectric layer 320A.

The device 300A further comprises an outer seal ring structure 318 formed in the seal ring region 304. The outer seal ring structure 318 is adjacent to and surrounds the seal ring structure 316A/316B. The outer seal ring structure 318 has a width W4 between about 2 microns and about 4 microns. The outer seal ring structure 318 is separated from the seal ring structure 316A/316B by a width W5. The width W5 is between about 2 microns and about 4 microns.

The seal ring structure 316A/316B and the outer seal ring structure 318 are constructed in some embodiments over the substrate 301 simultaneously with the construction of interconnects (not shown) in the circuit region 302. The seal ring structure 316A/316B, the outer seal ring structure 318 and interconnects may be comprised of various stacked metallization layers 312 and via layers 314 disposed within one or more dielectric layers 310B, 320B. The metallization layers 312 and via layers 314 may include a conductive material such as aluminum, aluminum alloy, copper, copper alloy, or combinations thereof. Interconnects and layers of the seal ring structure 316A/316B and the outer seal ring structure 318 share the same metallization layer 312 and via layer 314. Interconnects electrically connect integrated circuits and provide electrical connections from the integrated circuits to the upper layers. The seal ring structure 316A/316B and the outer seal ring structure 318 protect the integrated circuits in the circuit region 302 from moisture and contaminants. Also, the seal ring structure 316A/316B and the outer seal ring structure 318 protect the circuit region 302 from damage during dicing process. The outer seal ring structure 318 surrounds the seal ring structure 316A/316B to provide defense from moisture and dicing damage. In some embodiments, the outer seal ring structure 318 is omitted, leaving the seal ring structure 316A/316B as the only seal ring structure between the circuit region 302 and the scribe line region 306.

In one embodiment, the device 300A comprises a plurality of metallization layers 312, and the second portion 316B of the seal ring structure 316A/316B occupies several, e.g., three, top-most metallization layers of the plurality of metallization layers 312. The first portion 316A occupies the rest of the metallization layers 312. The outer seal ring structure 318 occupies all of the metallization layers 312.

Still referring to FIG. 4, a passivation layer 322 is disposed over the second dielectric layer 320A, the seal ring structure 316A/316B and the outer seal ring structure 318. The passivation layer 322 includes one or more layers, such as silicon nitride (SiN) or silicon oxynitride (SiON). The passivation layer 322 prevents or decreases moisture, mechanical, and radiation damage to the integrated circuits.

A metal pad 324 is disposed over the passivation layer 322. The metal pad 324 extends through the passivation layer 322 and is in contact with the top-most metallization layer 312 of the seal ring structure 316A/316B. Various depositing, patterning and etching techniques and processes may be used to form the structure of the metal pad 324. The metal pad 324 provides mechanical strength to protect the interface between the passivation layer 322 and the subsequently formed polyimide layer 326. Advantageously, the metal pad 324 has the effect of reducing chip edge cracks or interfacial delamination between the passivation layer 322 and the polyimide layer 326 during the die sawing process as well as chip use.

Still referring to FIG. 4, a polyimide layer 326 is disposed over the metal pad 324 and the passivation layer 322. The polyimide layer 326 serves as a stress buffer to reduce the stress transfer to the passivation layer 322 during an assembly process.

Advantageously, the seal ring structure 316A/316B with the narrow first portion 316A the wide second portion 316B provides extra space for functional circuits and robust strength for preventing the intrusion of any cracks into the circuit region 302.

FIG. 5 is a cross-sectional view of alternative seal ring structures obtained from the vertical plane crossing line C-C' in FIG. 3 of semiconductor device 300B. Some of the structures may be substantially similar to the embodiments disclosed in FIG. 4 and the description of the common structures are not repeated here although fully applicable in this embodiment as well.

Referring now to FIG. 5, the semiconductor device 300B may include a semiconductor substrate 301 having a seal ring region 304 and a scribe line region 306 surrounding a circuit region 302. In an embodiment, the seal ring region 304 is for forming a seal ring structure thereon and the circuit region 302 is for forming at least a transistor.

The device 300B may further include device structures such as transistors, resistors, and/or capacitors (not shown) overlying the substrate 301. The device 300B further includes contact bars 308 to electrically couple the substrate 301 to the subsequently formed outer seal ring structure 318.

Still referring to FIG. 5, a first dielectric layer 310A is disposed over the seal ring region 304, the scribe line region 306 and the circuit region 302 of the substrate 301. The first dielectric layer 310A has a bottom portion $310A_1$ and a top portion $310A_2$, and may contain multiple-level of dielectric layers 310B. In some embodiments, the dielectric layers 310B are formed of low-k dielectric materials with dielectric constants (k value) between about 2.9 and 3.8, ultra low-k (ULK) dielectric materials with k values between about 2.5 and about 2.9, or some combination of low-k dielectric materials.

A second dielectric layer 320A is disposed over the first dielectric layer 310A. The first dielectric layer 310A and the second dielectric layer 320A have different dielectric constants. In one embodiment, a dielectric constant of the first dielectric layer 310A is less than a dielectric constant of the second dielectric layer 320A. The second dielectric layer 320A has more capability to decreases moisture or mechanical damage to the underlying integrated circuits than the first dielectric layer 310A. The second dielectric layer 320A may contain multi-level of dielectric layers 320B. In one embodiment, the dielectric layers 320B are formed of oxide, undoped silicate glass (USG), or silicon dioxide ($SiO_2$).

Referring to FIG. 5, a seal ring structure 316C is disposed over the seal ring region 304 and embedded in both the second dielectric layer 320A and the top portion $310A_2$ of the first dielectric layer 310A. The seal ring structure 316C does not extend into the bottom portion $310A_1$ of the first dielectric layer 310A. The seal ring structure 316C is next to the circuit region 302. There is no other seal ring structure between the seal ring structure 316C and the circuit region 302. In one embodiment, the bottom portion $310A_1$ of the first dielectric layer 310A does not contain any seal ring structure. The seal ring structure 316C has a width W2 between about 4 microns and about 10 microns. In yet another embodiment, the device 300B further comprises an interconnect, a device structure or an alignment mark (not shown) disposed in the seal ring region 304 under the seal ring structure 316C. The device structure may include one or more transistors, resistors, and/or capacitors (not shown) overlying the substrate 301. Advantageously, the seal ring structure 316C does not extend into the bottom portion $310A_1$ of the first dielectric layer 310A that provides extra space under the seal ring structure 316C for functional integrated circuits and circuit routing in the seal ring region 304. Also, the seal ring structure 316C extends from the second dielectric layer 320A into the top portion $310A_2$ of the first dielectric layer 310A and provides robust strength for preventing the intrusion of any cracks into the circuit region 302 along the interface between the first dielectric layer 310A and the second dielectric layer 320A.

The device 300B further comprises an outer seal ring structure 318 formed in the seal ring region 304. The outer seal ring structure 318 is adjacent to and surrounds the seal ring structure 316C. The outer seal ring structure 318 has a width W4 between about 2 microns and about 4 microns. The outer seal ring structure 318 is separated from the seal ring structure 316A/316B by a width W5. The width W5 is between about 2 microns and about 4 microns.

The seal ring structure 316C and the outer seal ring structure 318 are constructed in some embodiments over the substrate 301 simultaneously with the construction of interconnects (not shown) in the circuit region 302. The seal ring structure 316C, the outer seal ring structure 318 and interconnects may be comprised of various stacked metallization layers 312 and via layers 314 disposed within one or more dielectric layers 310B, 320B. Interconnects, layers of the seal ring structure 316C and the outer seal ring structure 318 share the same metallization layer 312 and via layer 314. The seal ring structure 316C and the outer seal ring structure 318 protect the integrated circuits in the circuit region 302 from moisture, contaminations and damage during dicing process. The outer seal ring structure 318 surrounds the seal ring structure 316C to provide defense from moisture and dicing damage.

In one embodiment, the device 300B comprises a plurality of metallization layers 312 in the seal ring region 304, wherein the seal ring structure 316C occupies several, e.g., three, top-most metallization layers of the plurality of metallization layers 312. The outer seal ring structure 318 occupies all of the metallization layers 312.

Still referring to FIG. 5, a passivation layer 322, a metal pad 324 and a polyimide layer 326 are sequentially formed over the second dielectric layer 320A. The fabrication methods, materials and structures of these layers may be substantially similar to the embodiment disclosed in FIG. 4 and the descriptions are not repeated here.

Advantageously, the seal ring structure 316C does not extend into the bottom portion $310A_1$ of the first dielectric layer 310A, providing extra space for circuit routing and increased strength for preventing the intrusion of any cracks into the circuit region 302.

Referring now to FIG. 6 to FIG. 9 in conjunction with FIG. 1 and FIG. 3, various stages during fabrication of the semiconductor device 300A with a seal ring structure according to one or more embodiments according to FIG. 4 will be described.

Figure 6:
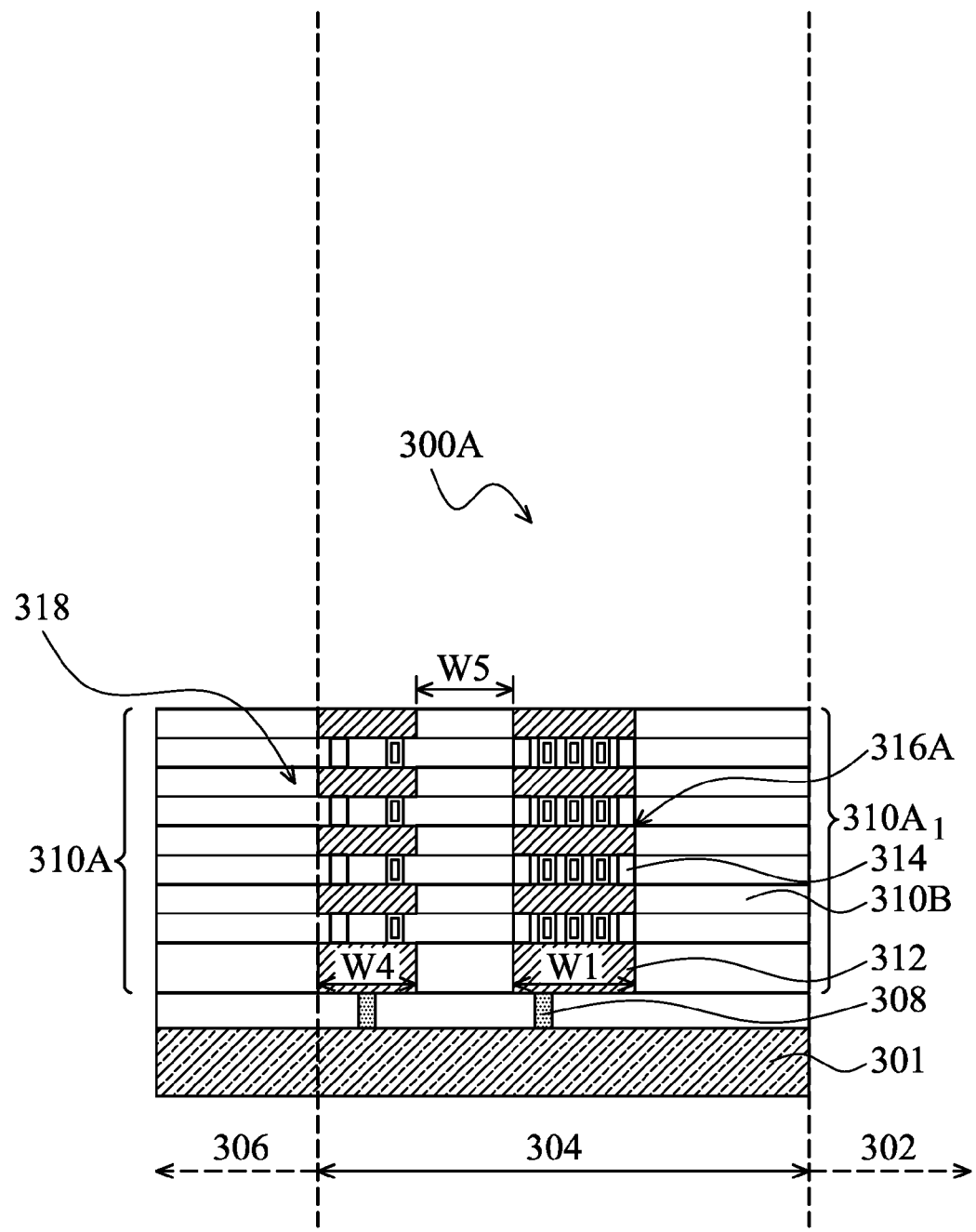
FIG. 6 to FIG. 9 are cross-sectional views showing various stages during fabrication of a semiconductor device with a seal ring structure according to one or more embodiments according to FIG. 4.

FIG. 6 illustrates a stage in which a semiconductor substrate 301 is provided, e.g., in accordance with block 102 of FIG. 1. The substrate 301 has a seal ring region 304 and a scribe line region 306 surrounding a circuit region 302. The semiconductor substrate 301 may include silicon or compound semiconductor, such as GaAs, InP, Si/Ge, or SiC. The substrate 301 may further include doped regions, such as a P-well, an N-well, and/or a doped active region such as a P+ doped active region. The device structures such as transistors, resistors, and/or capacitors (not shown) are formed overlying the substrate 301. Contact bars 308 are formed to electrically couple the substrate 301 to the subsequently formed seal ring structures 318/316A/316B.

Next, a first dielectric layer 310A is formed over the seal ring region 304, the scribe line region 306 and the circuit region 302 of the substrate 301, e.g., in accordance with block 104 of FIG. 1. The first dielectric layer 310A has a bottom portion 310A$_1$ which is formed first, as exemplarily illustrated in FIG. 6, and a top portion 310A$_2$ which will be formed later, as exemplarily illustrated in FIG. 7. The first dielectric layer 310A may contain multiple-level of dielectric layers 310B. In one example, the dielectric layer 310B is formed by conventional deposition techniques, such as chemical vapor deposition (CVD) and/or a high density plasma (HDP) CVD process. In some embodiments, the dielectric layers 310B are formed of low-k dielectric materials with dielectric constants (k value) between about 2.9 and 3.8, ultra low-k (ULK) dielectric materials with k values between about 2.5 and about 2.9, or some combination of low-k dielectric materials.

A first portion 316A of a seal ring structure is formed over the seal ring region 304 and embedded in the bottom portion 310A$_1$ of the first dielectric layer 310A, e.g., in accordance with block 106 of FIG. 1. The seal ring structure is next to the circuit region 302 and there is no other seal ring structure between the seal ring structure and the circuit region 302. In one example, the first portion 316A has a width W1. In another embodiment, the seal ring structure further comprises a third portion (e.g., third portion 316C in FIG. 14) below the first portion 316A. The third portion has a width W3 (e.g., "W3" in FIG. 14), which is less than W1.

Optionally, an outer seal ring structure 318 is formed in the seal ring region 304. The outer seal ring structure 318 is adjacent to and surrounds the first portion 316A of the seal ring structure. The outer seal ring structure 318 has a width W4 between about 2 microns and about 4 microns. The outer seal ring structure 318 is separated from the seal ring structure 316A by a width W5. The width W5 is between about 2 microns and about 4 microns.

The seal ring structure's first portion 316A and the outer seal ring structure 318 are constructed in some embodiments over the substrate 301 simultaneously with the construction of the interconnects in the circuit region 302. The seal ring structure's first portion 316A, the outer seal ring structure 318 and interconnects the may be comprised of various stacked metallization layers 312 and via layers 314 disposed within one or more dielectric layers. Interconnects, layers of the seal ring structure 316A and the outer seal ring structure 318 share the same metallization layer 312 and via layer 314. The metallization layers 312 and the via layers 314 may be formed by various depositing, patterning and etching techniques. The metallization layers 312 and via layers 314 may include a conductive material such as aluminum, aluminum alloy, copper, copper alloy, or combinations thereof.

Figure 7:
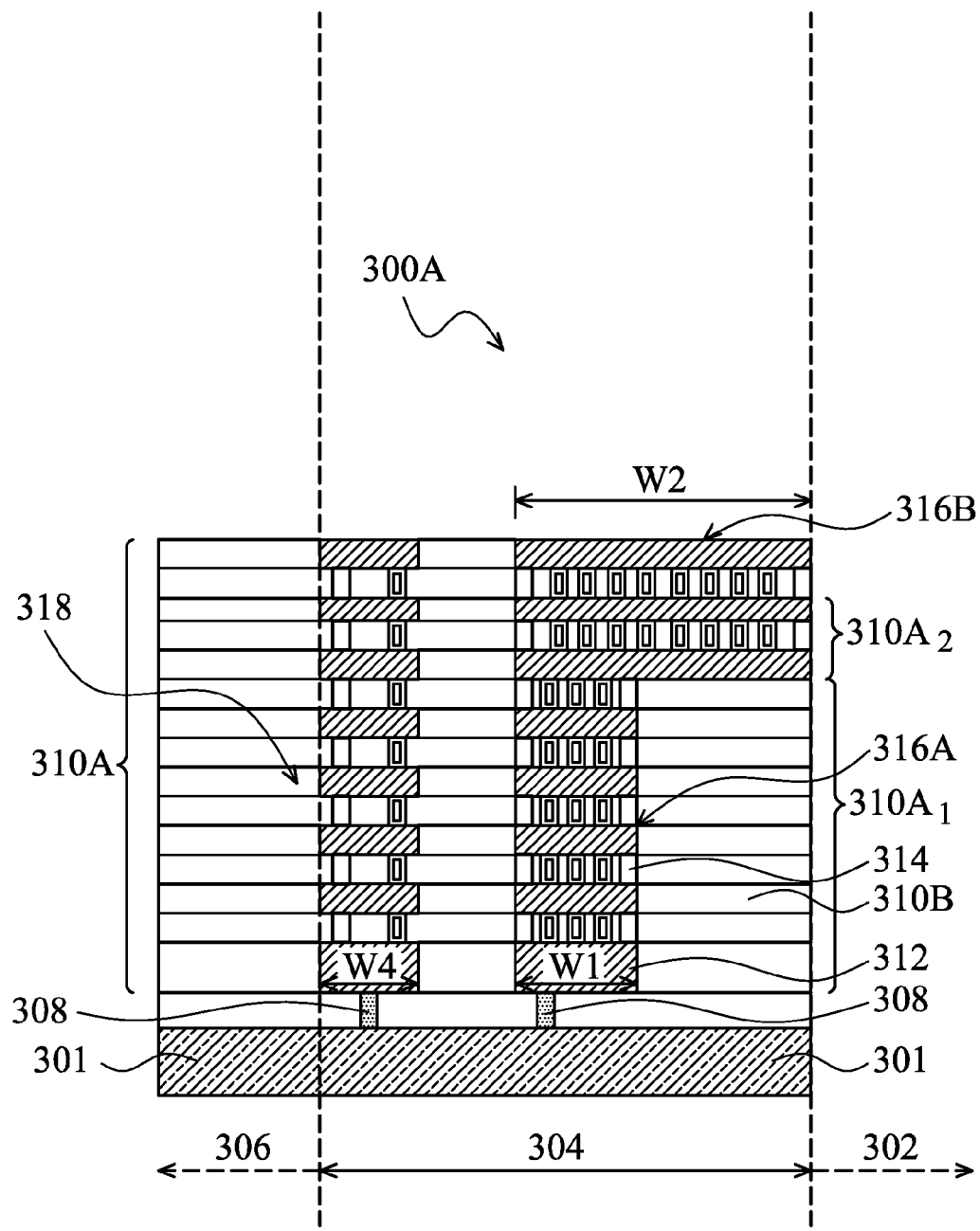

Referring to FIG. 7, the top portion 310A$_2$ of the first dielectric layer 310A is subsequently formed on the bottom portion 310A$_1$ shown in FIG. 6. The outer seal ring structure 318 continues to extend into the top portion 310A$_2$ of the first dielectric layer 310A by alternately stacking the metallization layers 312 and the via layers 314. A second portion 316B of the seal ring structure is formed above the first portion 316A of the seal ring structure. The second portion 316B is also embedded in the top portion 310A$_2$ of the first dielectric layer 310A by alternately stacking the metallization layers 312 and the via layers 314. In one example, the second portion 316B has a width W2 between about 4 microns and about 10 microns. The first portion 316A has a width W1, which is less than the width W2. The width W1 is less than 75 percent of the width W2 in some embodiments. In other embodiments, the width W3 of the third portion is less than 50 percent of the width W2.

In yet another embodiment, the device 300A further comprises an interconnect, a device structure or an alignment mark (not shown) formed in the seal ring region 304 under the second portion 316B and adjacent to the first portion 316A, i.e., between the first portion 316A and the circuit region 302. The device structure may include one or more of transistors, resistors, and/or capacitors (not shown) overlying the substrate 301. Advantageously, the seal ring structure 316A/316B with the narrow first portion 316A provides extra space for functional integrated circuits and circuit routing.

Figure 8:
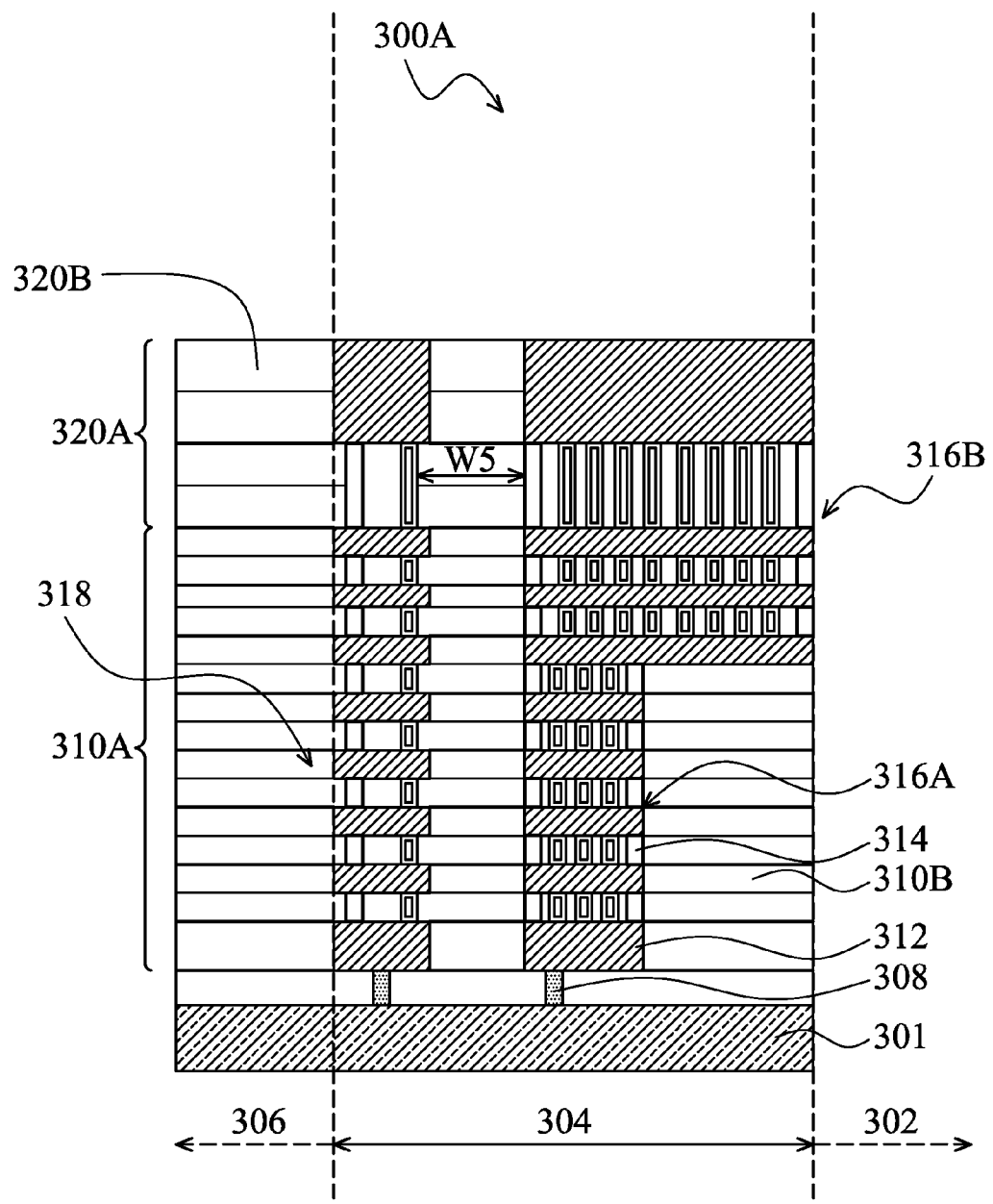

Referring to FIG. 8, a second dielectric layer 320A is formed over the first dielectric layer 310A e.g., in accordance with block 108 of FIG. 1. The first dielectric layer 310A and the second dielectric layer 320A have different dielectric constants. In one embodiment, a dielectric constant of the first dielectric layer 310A is less than a dielectric constant of the second dielectric layer 320A. The second dielectric layer 320A may contain multi-level of dielectric layers 320B. The dielectric layer 320B may be formed by conventional deposition techniques, such as chemical vapor deposition (CVD) and/or a high density plasma (HDP) CVD process. In one embodiment, the dielectric layers 320B are formed of oxide, undoped silicate glass (USG), or silicon dioxide (SiO$_2$).

The outer seal ring structure 318 continues to extend into the second dielectric layer 320A by alternately stacking the metallization layers 312 and the via layers 314. The second portion 316B of the seal ring structure is also embedded in the second dielectric layer 320A by alternately stacking the metallization layers 312 and the via layers 314. The second portion 316B is embedded in both the first dielectric layer 310A and the second dielectric layer 320A, e.g., in accordance with block 110 of FIG. 1. In one embodiment, the device 300A comprises a plurality of metallization layers 312 formed, and the second portion 316B of the seal ring structure occupies the most top three metallization layers of the plurality of metallization layers 312. The first portion 316A occupies the rest of the metallization layers 312. In another embodiment, the outer seal ring structure 318 occupies all of the metallization layers 312. The seal ring structure 316A/316B with the wide second portion 316B provides robust strength for preventing the intrusion of any cracks into the circuit region 302 along the interface between the first dielectric layer 310A and the second dielectric layer 320A.

Figure 9:
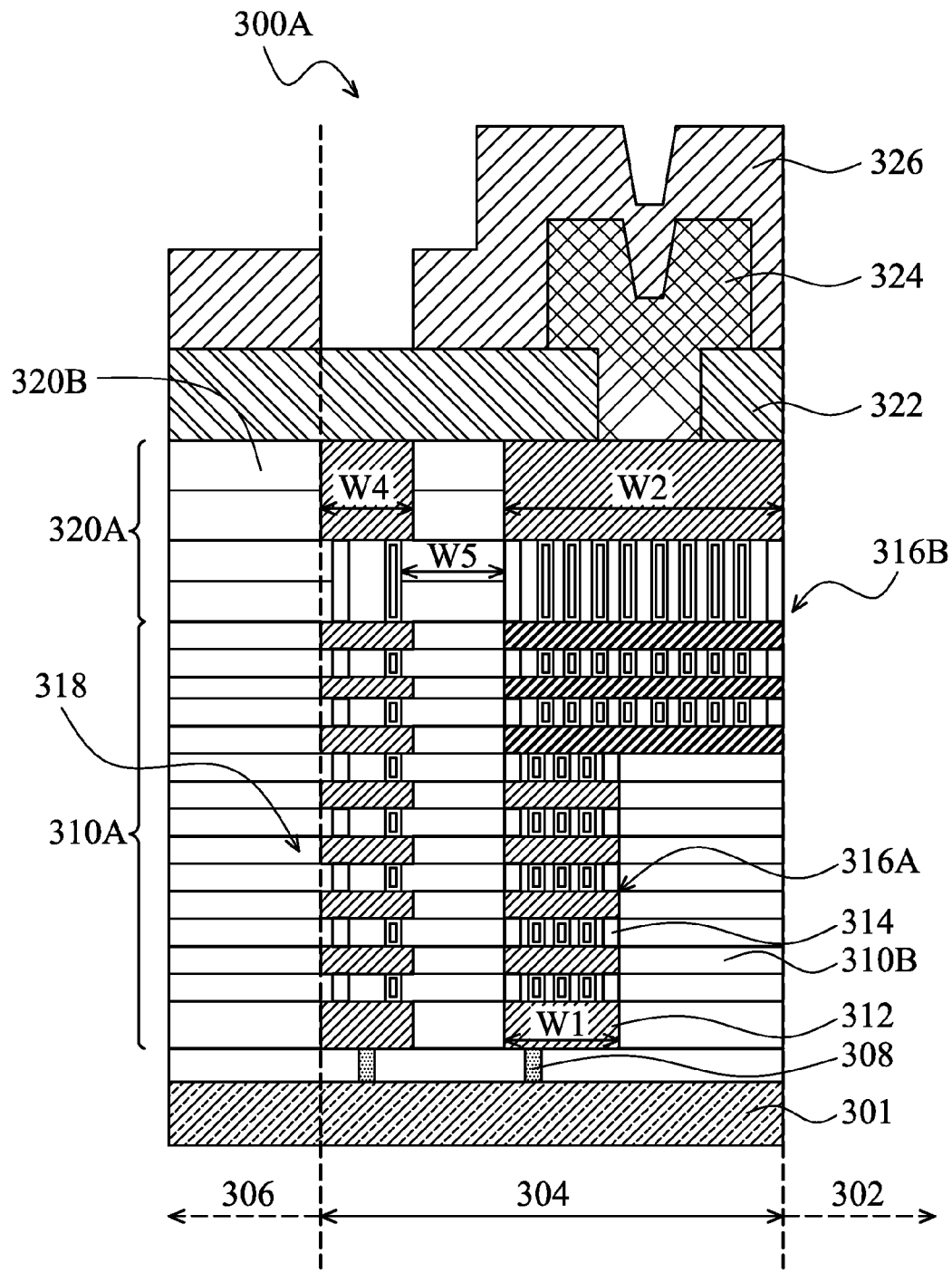

Referring to FIG. 9, a passivation layer 322 is disposed over the second dielectric layer 320A, the seal ring structure 316A/316B and the outer seal ring structure 318. The passivation layer 322 includes one or more layers, such as silicon nitride (SiN) or silicon oxynitride (SiON). The passivation layer 322 may be deposited by conventional deposition techniques, such as chemical vapor deposition (CVD). Photolithography and etching follow the deposition to selectively pattern the desired structures. The passivation layer 322 prevents or decreases moisture, mechanical, and radiation damage to the integrated circuits.

A metal pad 324 is formed and extends into the passivation layer 322 to contact the most top metallization layer 312 in the seal structure 316A/316B. The metal pad 324 is deposited by physical vapor deposition (PVD) such as a sputtering deposition using a sputtering target made of aluminum, copper or an alloy thereof, followed by patterning the deposited layer with photolithography and etching.

A polyimide layer 326 is formed over the metal pad 324 and the passivation layer 322. The polyimide layer 326 serves as a stress buffer to reduce the stress transfer to the passivation layer 322 during assembly process.

Referring now to FIG. 10 to FIG. 13 in conjunction with FIG. 2 and FIG. 3, various stages during fabrication of the semiconductor device 300B with a seal ring structure according to one or more embodiments according to FIG. 5 will be described. The fabrication methods, materials and structures of these layers may be substantially similar to the embodiments disclosed in FIG. 6 to FIG. 9 and the descriptions are not repeated here.

Figure 10:
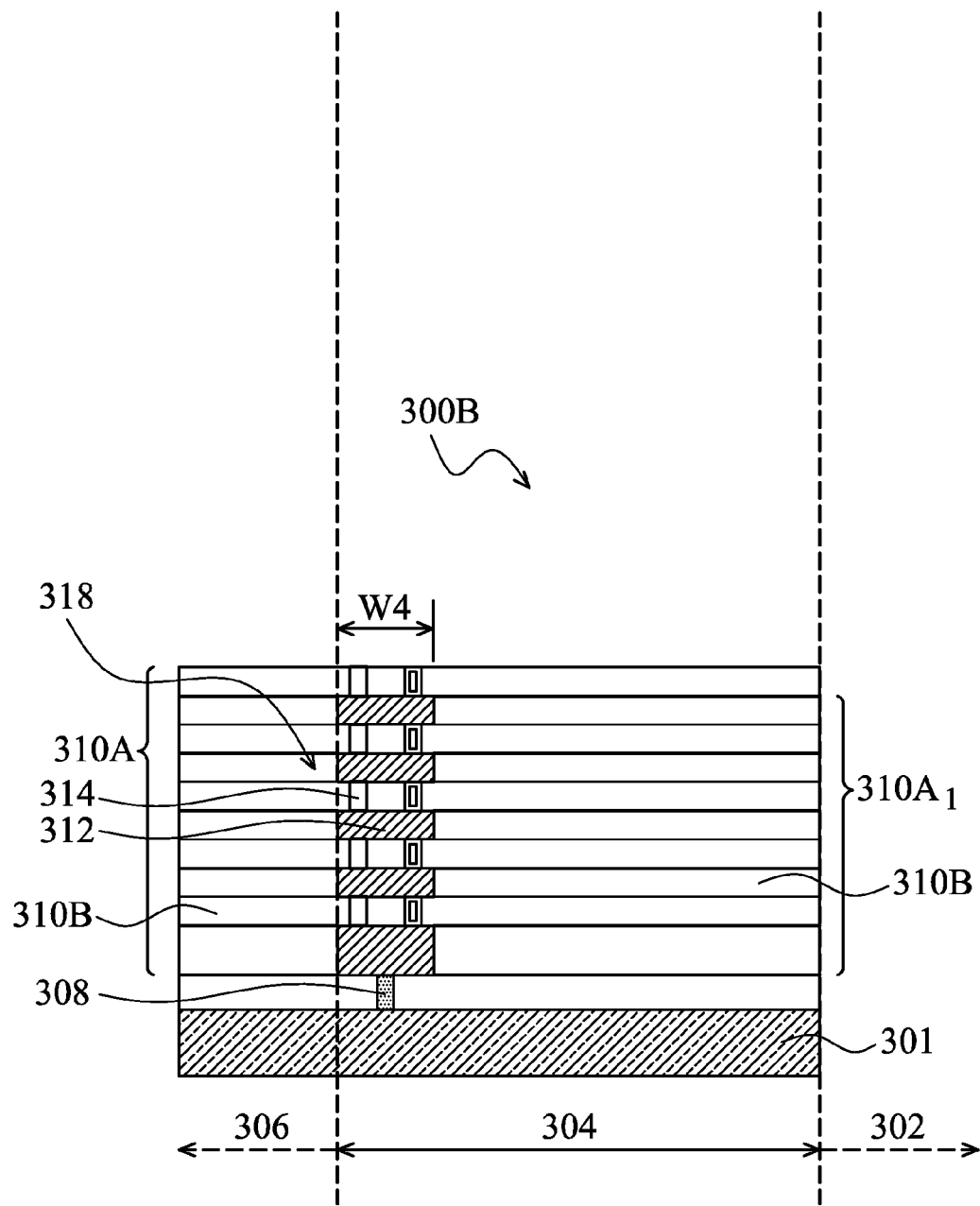
FIG. 10 to FIG. 13 are cross-sectional views showing various stages during fabrication of a semiconductor device with a seal ring structure according to one or more embodiments according to FIG. 5.

FIG. 10 illustrates a stage in which a semiconductor substrate 301 is provided, e.g., in accordance with block 202 of FIG. 2. The substrate 301 has a seal ring region 304 and a scribe line region 306 surrounding a circuit region 302. The device structures such as transistors, resistors, and/or capacitors (not shown) are formed overlying the substrate 301. Contact bars 308 are formed to electrically couple the substrate 301 to the subsequently formed seal ring structure 318.

Next, a first dielectric layer 310A is formed over the seal ring region 304, a scribe line region 306 and a circuit region 302 of the substrate 301, e.g., in accordance with block 204 of FIG. 2. The first dielectric layer 310A has a bottom portion $310A_1$ which is formed first, as exemplarily illustrated in FIG. 10, and a top portion $310A_2$ which will be formed later, as exemplarily illustrated in FIG. 11. The first dielectric layer 310A may contain multi-level of dielectric layers 310B. In some embodiments, the dielectric layers 310B are formed of low-k dielectric materials with dielectric constants (k value) between about 2.9 and 3.8, ultra low-k (ULK) dielectric materials with k values between about 2.5 and about 2.9, or some combination of low-k dielectric materials.

An outer seal ring structure 318 is formed in the seal ring region 304 and embedded in the bottom portion $310A_1$ of the first dielectric layer 310A. The outer seal ring structure 318 has a width W4 between about 2 microns and about 4 microns. The outer seal ring structure 318 are constructed in some embodiments over the substrate 301 simultaneously with the construction of the interconnects (not shown) in the circuit region 302. The outer seal ring structure 318 and the interconnects the may be comprised of various stacked metallization layers 312 and via layers 314 disposed within one or more dielectric layers. The interconnects and layer of the outer seal ring structure 318 share the same metallization layer 312 and via layer 314. The metallization layers 312 and the via layers 314 may be formed by various depositing, patterning and etching techniques.

Figure 11:
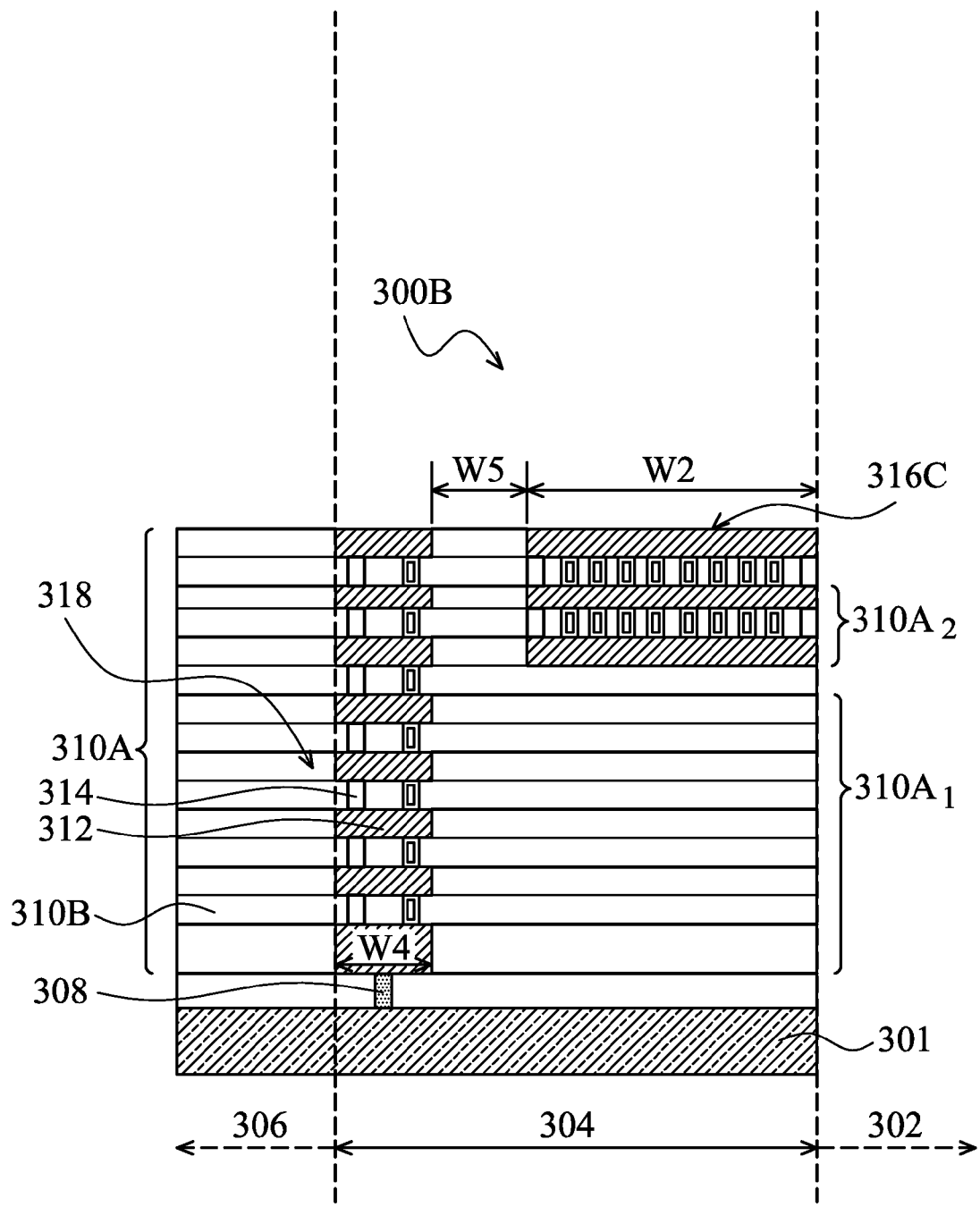

Referring to FIG. 11, the top portion $310A_2$ of the first dielectric layer 310A is subsequently formed on the bottom portion $310A_1$ shown in FIG. 10. The outer seal ring structure 318 continues to extend into the top portion $310A_2$ of the first dielectric layer 310A by alternately stacking the metallization layers 312 and the via layers 314. A seal ring structure 316C is also formed and embedded in the top portion $310A_2$ by alternately stacking the metallization layers 312 and the via layers 314. The seal ring structure 316C does not extend into the bottom portion $310A_1$ of the first dielectric layer 310A. The seal ring structure 316C is next to the circuit region 302. There is no other seal ring structure between the seal ring structure 316C and the circuit region 302. In one embodiment, the bottom portion $310A_1$ of the first dielectric layer 310A does not contain any seal ring structure.

In one example, the seal ring structure 316C has a width W2 between about 4 microns and about 10 microns. The outer seal ring structure 318 is separated from the seal ring structure 316C by a width W5. The width W5 is between about 2 microns and about 4 microns.

Advantageously, the seal ring structure 316C does not extend into the bottom portion $310A_1$ of the first dielectric layer 310A that provides extra space under the seal ring structure 316C for functional integrated circuits and circuit routing. In one embodiment, the device 300B further comprises an interconnect, a device structure or an alignment mark (not shown) disposed in the seal ring region 304 under the seal ring structure 316C. The device structure may include one or more transistors, resistors, and/or capacitors (not shown) overlying the substrate 301.

Figure 12:
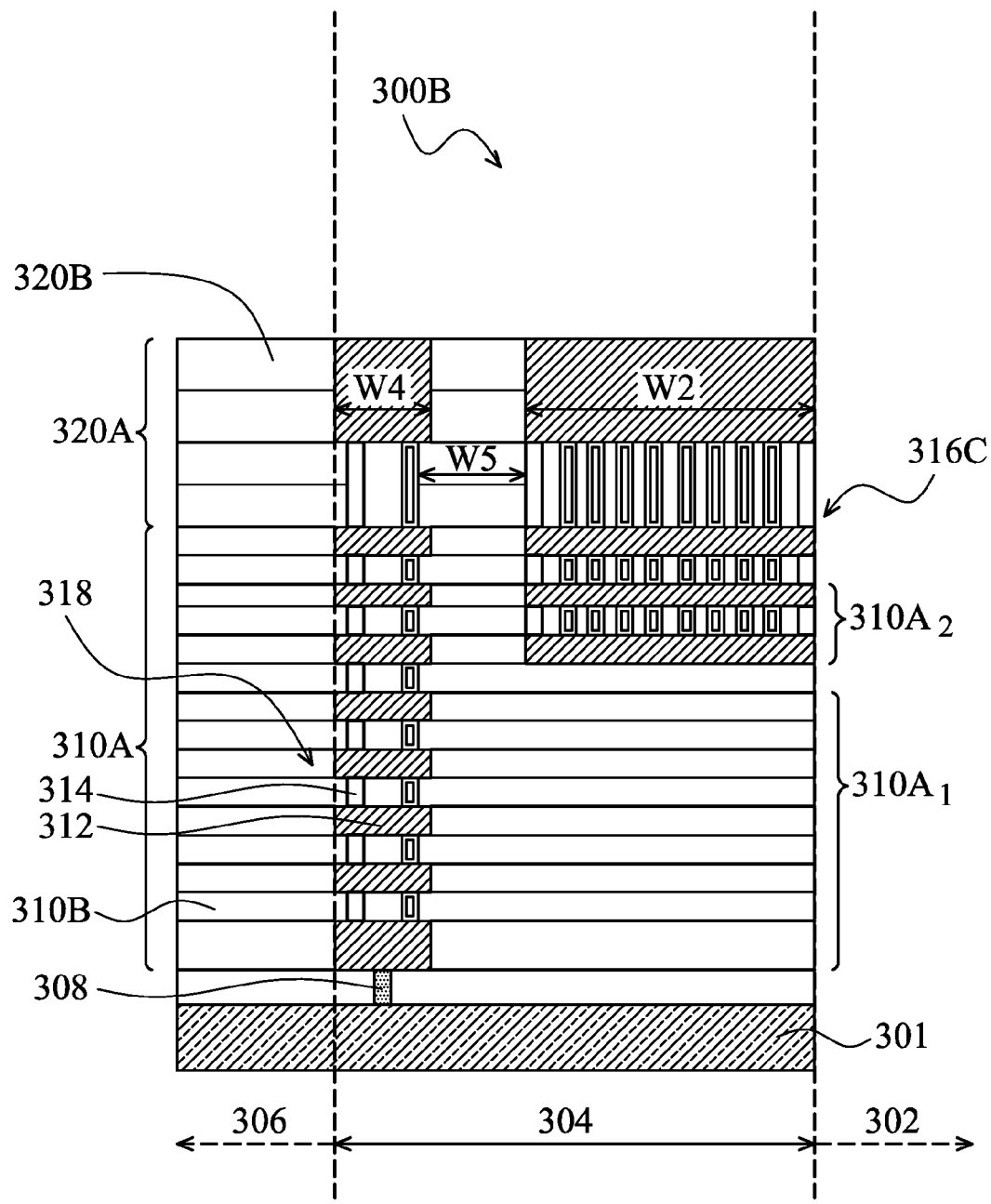

Referring to FIG. 12, a second dielectric layer 320 A is formed over the first dielectric layer 310A, e.g., in accordance with block 206 of FIG. 2. The first dielectric layer 310A and the second dielectric layer 320A have different dielectric constants. In one embodiment, a dielectric constant of the first dielectric layer 310A is less than a dielectric constant of the second dielectric layer 320A. The second dielectric layer 320A may contain multi-level of dielectric layers 320B. In one embodiment, the dielectric layers 320B are formed of oxide, undoped silicate glass (USG), or silicon dioxide ($SiO_2$).

The outer seal ring structure 318 and the seal ring structure 316C continue to extend into the second dielectric layer 320A by alternately stacking the metallization layers 312 and the via layers 314. The seal ring structure 316C is embedded in both the top portion $310A_2$ of the first dielectric layer 310A and the second dielectric layer 320A, e.g., in accordance with block 208 of FIG. 2. In one embodiment, the device 300B comprises a plurality of metallization layers 312 formed, and the seal ring structure 316C occupies the most top three metallization layers of the plurality of metallization layers 312. In another embodiment, the outer seal ring structure 318 occupies all of the metallization layers 312. Advantageously, the seal ring structure 316C extends from the second dielectric layer 320A into the top portion $310A_2$ of the first dielectric layer 310A and provides robust strength for preventing the intrusion of any cracks into the circuit region 302 along the interface between the first dielectric layer 310A and the second dielectric layer 320A.

Figure 13:
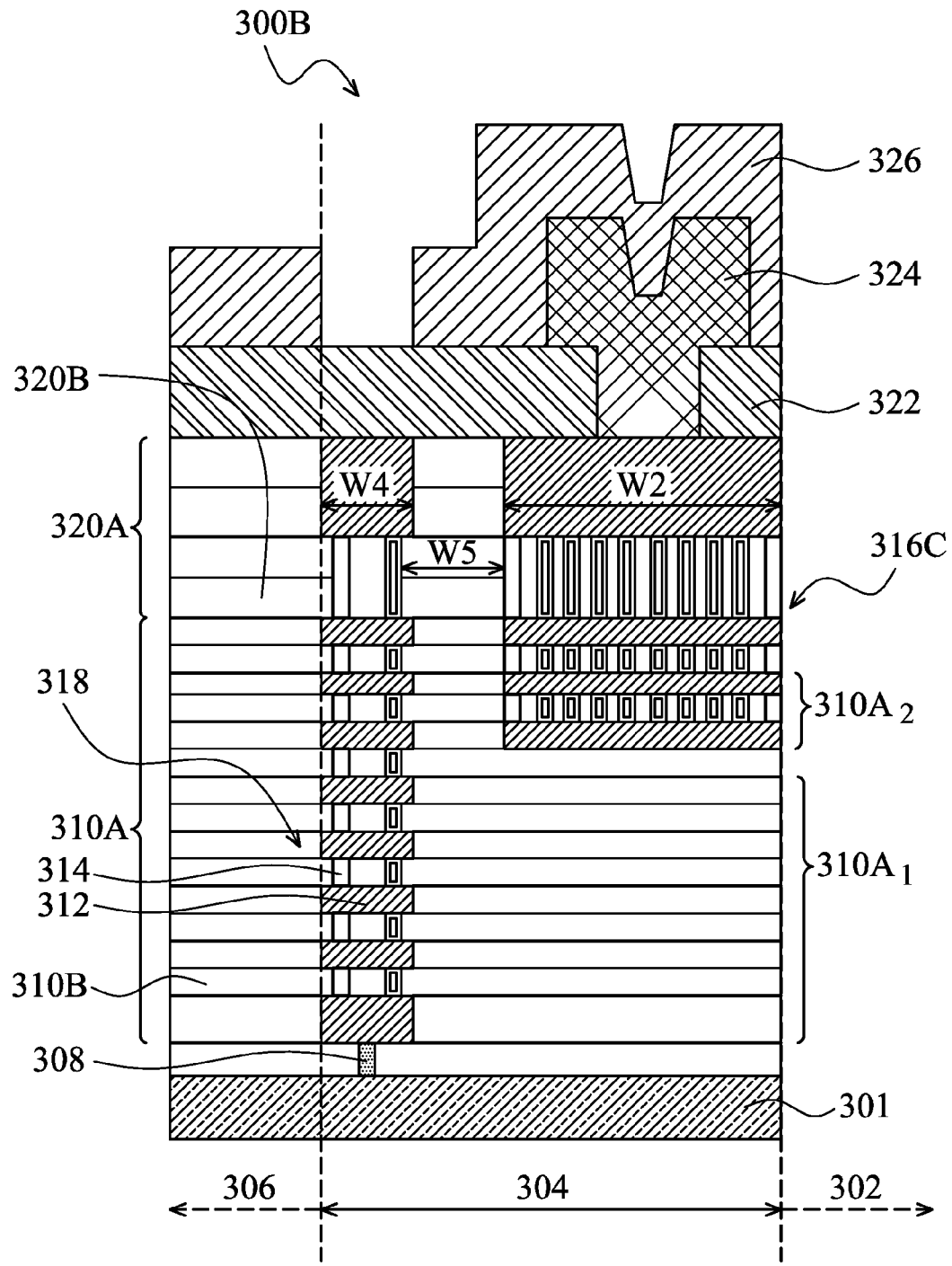

Referring to FIG. 13, a passivation layer 322, a metal pad 324 and a polyimide layer 326 are sequentially formed over the second dielectric layer 320A. The device 300B is formed. The fabrication methods, materials and structures of these layers may be substantially similar to the embodiment disclosed in FIG. 9 and the descriptions are not repeated here.

In some embodiments, a top portion of a seal ring structure is embedded in both the second dielectric layer and the top portion of the first dielectric layer. The top portion of the seal ring structure prevents crack, peeling, or delamination along the interface of the first dielectric layer and the second dielectric layer. The yield of the packing process is thus significantly increased. In further embodiments, a bottom portion the seal ring structure, which is narrower than the top portion, is formed in the first dielectric layer to provide extra space for functional integrated circuits and circuit routing in the seal ring region.

Although exemplary embodiments and the respective advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A semiconductor device, comprising:
   a substrate having a circuit region and a seal ring region, the seal ring region surrounding the circuit region; and
   a seal ring structure disposed over the seal ring region, the seal ring structure having a first portion and a second portion above the first portion, wherein
      the first portion comprises:
         at least one first metallization layer defining a width W1 of the first portion; and
         at least one first via layer directly on the at least one first metallization layer, a via of the at least one first via layer having a width less than the width W1;
      the second portion comprises:
         at least one second metallization layer defining a width W2 of the second portion; and
         at least one second via layer directly on the at least one second metallization layer, a via of the at least one second via layer having a width less than the width W2; and
      the width W1 is less than the width W2.

2. The semiconductor device of claim 1, further comprising:
   a first dielectric layer disposed over the seal ring region;
   a second dielectric layer disposed over the first dielectric layer, wherein the first dielectric layer and the second dielectric layer have different dielectric constants; and
   the seal ring structure embedded in both the first dielectric layer and the second dielectric layer, wherein the first portion is in the first dielectric layer and the second portion is in both the first dielectric layer and the second dielectric layer.

3. The semiconductor device of claim 2, wherein the dielectric constant of the first dielectric layer is less than the dielectric constant of the second dielectric layer.

4. The semiconductor device of claim 1, wherein the semiconductor device is devoid of any other seal ring structure between the seal ring structure and the circuit region.

5. The semiconductor device of claim 1, further comprising a plurality of metallization layers in the seal ring region, the plurality of metallization layers comprising the at least one first metallization layer and the at least one second metallization layer, wherein the second portion occupies three topmost metallization layers of the plurality of metallization layers.

6. The semiconductor device of claim 1, further comprising, in the seal ring region, an outer seal ring structure surrounding the seal ring structure.

7. The semiconductor device of claim 6, further comprising a plurality of metallization layers in the seal ring region, the plurality of metallization layers comprising the at least one first metallization layer and the at least one second metallization layer, wherein the outer seal ring structure occupies all of the plurality of metallization layers.

8. The semiconductor device of claim 1, further comprising an interconnect, a device structure or an alignment mark in the seal ring region under the second portion and adjacent to the first portion.

9. The semiconductor device of claim 1, wherein the width W1 is less than 75 percent of the width W2.

10. The semiconductor device of claim 1, wherein the seal ring structure further comprises a third portion below the first portion, the third portion having a width W3 less than the width W1.

11. A semiconductor device, comprising:
    a substrate having a circuit region and a seal ring region, the seal ring region surrounding the circuit region; and
    a seal ring structure disposed over the seal ring region, the seal ring structure having a first portion and a second portion above the first portion, wherein the first portion has a width W1, the second portion has a width W2, and the width W1 is less than the width W2,
    wherein the seal ring structure further comprises a third portion below the first portion, the third portion having a width W3 less than the width W1, and the width W3 being less than 50 percent of the width W2.

12. A semiconductor device, comprising:
    a substrate having a circuit region and a seal ring region, the seal ring region surrounding the circuit region;
    a first dielectric layer disposed over the seal ring region, the first dielectric layer having a bottom portion and a top portion above the bottom portion;
    a second dielectric layer disposed over the first dielectric layer, wherein the first dielectric layer and the second dielectric layer have different dielectric constants;
    a seal ring structure embedded in both the second dielectric layer and the top portion of the first dielectric layer, wherein the seal ring structure does not extend into the bottom portion of the first dielectric layer; and
    an outer seal ring structure embedded in both the first and second dielectric layers, the outer seal ring structure surrounding the seal ring structure and extending into the bottom portion of the first dielectric layer.

13. The semiconductor device of claim 12, wherein the dielectric constant of the first dielectric layer is less than the dielectric constant of the second dielectric layer.

14. The semiconductor device of claim 12, wherein the semiconductor device is devoid of any other seal ring structure between the seal ring structure and the circuit region.

15. The semiconductor device of claim 12, further comprising a plurality of metallization layers in the seal ring region, wherein the seal ring structure occupies three topmost metallization layers of the plurality of metallization layers.

16. The semiconductor device of claim 12, further comprising a plurality of metallization layers in the seal ring region, wherein the outer seal ring structure occupies all of the plurality of metallization layers.

17. The semiconductor device of claim 12, further comprising an interconnect, a device structure or an alignment mark in the seal ring region under the seal ring structure.

18. A semiconductor manufacturing method, comprising:
providing a substrate having a seal ring region and a circuit region;
forming a first dielectric layer over the seal ring region, the first dielectric layer having a bottom portion and a top portion above the bottom portion;
forming a second dielectric layer over the first dielectric layer, wherein the first dielectric layer and the second dielectric layer have different dielectric constants;
forming a seal ring structure embedded in both the second dielectric layer and the top portion of the first dielectric layer in the seal ring region; and
forming an outer seal ring structure embedded in both the first and second dielectric layers, the outer seal ring structure surrounding the seal ring structure,
wherein the seal ring structure and the outer seal ring structure comprise at least one common first metallization layer,
wherein a width of the first metallization layer in the seal ring structure is greater than a width of the first metallization layer in the outer seal ring structure,
wherein the seal ring structure does not extend into the bottom portion of the first dielectric layer, and
wherein the outer seal ring structure extends into the bottom portion of the first dielectric layer.

19. The semiconductor manufacturing method of claim 18, wherein
the seal ring structure further comprises a second metallization layer embedded in the bottom portion of the first dielectric layer in the seal ring region, and
the width of the first metallization layer in the seal ring structure is greater than a width of the second metallization layer.

* * * * *